(12) United States Patent
Joei

(10) Patent No.: US 6,869,810 B2
(45) Date of Patent: Mar. 22, 2005

(54) MANUFACTURING METHOD OF SEMICONDUCTOR DEVICE

(75) Inventor: Masahiro Joei, Takatsuki (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 10/843,364

(22) Filed: May 12, 2004

(65) Prior Publication Data

US 2004/0229389 A1 Nov. 18, 2004

(30) Foreign Application Priority Data

May 13, 2003 (JP) ........................................ 2003-133837

(51) Int. Cl.[7] ........................... G01R 31/26; H01L 21/66
(52) U.S. Cl. ........................ 438/14; 438/618; 438/622; 438/672; 438/906
(58) Field of Search ........................... 438/14, 618, 622, 438/672, 906, FOR 101, FOR 142

(56) References Cited

U.S. PATENT DOCUMENTS 5,888,906 A * 3/1999 Sandhu et al. .............. 438/706
6,020,254 A * 2/2000 Taguwa ...................... 438/618
6,313,042 B1 * 11/2001 Cohen et al. ................ 438/734
6,503,842 B2 * 1/2003 Sandhu et al. .............. 438/706

FOREIGN PATENT DOCUMENTS

JP          2-124406          5/1990

* cited by examiner

Primary Examiner—George Fourson
Assistant Examiner—Michelle Estrada
(74) Attorney, Agent, or Firm—Parkhurst & Wendell, L.L.P.

(57) ABSTRACT

A manufacturing method of a semiconductor device, including the steps of forming a metal wire on a circuit formed on a semiconductor substrate, forming an insulating film on the metal wire, forming a via hole in the insulating film so as to expose a surface of the metal wire by selectively etching the insulating film by a plasma dry etching method, measuring a first level difference between the surface of the metal wire and the surface of the insulating film by a non-contact measurement method, removing the metal oxide film on the surface of the metal film by cleaning the surface of the metal film, measuring a second level difference between the surface of the metal film and the surface of the insulating film by a non-contact measurement method, and determining an amount of oxidation of the metal wire from a difference between the first and the second level differences.

8 Claims, 5 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device and, in particular, to the manufacturing of a wire structure.

2. Description of the Related Art

In recent years, copper that has a lower resistance than that of aluminum has come to be used as a wire material in semiconductor integrated circuits. The Damascene method is used in the manufacturing of a semiconductor device wherein wire trenches are formed in an interlayer insulating film using a dry etching technique, and the wire material is filled into these wire trenches.

In the following, a conventional manufacturing method of a wire will be described with reference to FIGS. 5A to 5F.

FIGS. 5A to 5F are cross sectional views showing a conventional manufacturing processes in sequence of a semiconductor device that uses a copper wire, wherein FIG. 5A is a cross sectional view showing a conventional process of forming a via hole resist pattern, FIG. 5B is a cross sectional view showing a conventional process of forming a via hole, FIG. 5C is a cross sectional view showing a conventional process of removing the resist pattern, FIG. 5D is a cross sectional view showing a conventional process of forming an opening in an insulating film, FIG. 5E is a cross sectional view showing a conventional process of cleaning the bottom of the via hole, and FIG. 5F is a cross sectional view showing a conventional process of forming a metal plug.

First, in the process of forming the resist pattern shown in FIG. 5A, a copper wire 73 is formed above a semiconductor substrate 71 made of silicon, in such a manner that the side surfaces and the bottom surface of the copper wire 73 are covered with an insulating film 72 made of silicon oxide. Subsequently, an insulating film 74 made of silicon nitride is formed on top of the insulating film 72 and the copper wire 73. An insulating film 75 made of silicon oxide is formed on the insulating film 74, and thereafter a resist pattern 76 with an opening 77 is formed.

Next, in the process of forming a via hole shown in FIG. 5B, etching is carried out on the insulating film 75 using the resist pattern 76 as a mask by the plasma dry etching method, so that a via hole 77a is formed.

Next, in the ashing process shown in FIG. 5C, the resist pattern 76 is removed and, after that, in the process of exposing the metal wire shown in FIG. 5D, the entire surface of the semiconductor device is etched back by the plasma dry etching method, so that a via hole 77b is formed so as to expose the copper wire 73 from the insulating film 74. In this process, for example, a parallel plate type RIE unit is used wherein the flow rate of $CF_4$ which is an etching gas is set at 50 sccm, the flow rate of $O_2$ which is a control gas for the etching deposit is set at 10 sccm, the temperature of the substrate is set at 25° C., the RF output is set at 300 W and the pressure is set at 5 Pa. At this time, $O_2$ is used for controlling the deposit which is an etching reaction product; therefore, the surface of the base copper wire 73 is oxidized, so that a copper oxide layer 78 is formed.

Finally, as shown in FIG. 5E, the semiconductor device is cleaned with a chemical having an etching selectivity of copper oxide to copper that is almost infinite in a typical cleaning manner using a chemical that includes an organic acid such as ammonium fluoride or ammonium acetate, so that the copper oxide layer 78 is removed. After that, as shown in FIG. 5F, a metal plug 79, also made of copper, is formed as a portion of the upper layer wire that includes the portions making contact with the bottom and walls of the via hole 77b.

OBJECT AND SUMMARY OF THE INVENTION

As shown in FIG. 5D, at the time when the insulating film 74 is processed by the plasma dry etching method, oxidation on the surface of the base copper wire 73 progresses so that the copper oxide 78 is formed depending on the radio frequency (RF) output for the generation of plasma in the etching unit and on the time of etching. On the other hand, the cleaning chemical used in the process of FIG. 5E allows for the removal of the copper oxide 78 with a low etching rate of, for example, approximately 0.5 nm, which indicates a process time limit of 10 to 20 minutes taking throughput of the process or the productivity into account. Accordingly, when the amount of formation of the copper oxide 78 is great, etching with the chemical becomes insufficient and a problem arises that when the copper oxide thickness becomes great exceeding 10 nm, for instance, the dispersion of the contact resistance becomes great as seen from the relationship between the amount of copper oxidation and the contact resistance of the copper wire/copper plug shown in FIG. 4. Therefore, it is necessary to manage and control the amount of growth of the copper oxide 78 as well as the radio frequency output and the time of etching in the etching unit during the process of dry etching of the insulating film 74.

Conventionally, measurement and evaluation outside of the manufacturing line such as a SIMS analysis is required in order to quantitatively obtain the amount of oxidation of a copper wire. Therefore, it takes a long period of time for detection of copper oxidation even in the case where the copper oxidation progresses excessively during the manufacturing process. In addition, a problem arises that a process feedback including the dry etching conditions can not be made quickly.

An object of a manufacturing method of a semiconductor device according to the present invention is to quantitatively obtain with ease the amount of copper oxide formation in the base copper wire within the manufacturing line in order to solve the above-described problems.

In order to solve the above-described problems a manufacturing method of a semiconductor device according to the first aspect of the present invention is characterized by comprising the steps of: forming a metal wire on a circuit formed on a semiconductor substrate; forming an insulating film on the metal wire; forming a via hole in the insulating film so as to expose a surface of the metal wire by selectively etching the insulating film by a plasma dry etching method; measuring a first level difference between the surface of the metal wire and the surface of the insulating film by a non-contact measurement method; removing the metal oxide film on the surface of the metal film by cleaning the surface of the metal film; measuring a second level difference between the surface of the metal film and the surface of the insulating film by a non-contact measurement method; and determining the amount of oxidation of the metal wire from a difference between the first level difference and the second level difference.

A manufacturing method of a semiconductor device according to the second aspect of the present invention is characterized by comprising the steps of: forming a metal wire on a circuit formed on a semiconductor substrate; forming an insulating film on the metal wire; forming a via hole in the insulating film so as to expose a surface of the metal wire by selectively etching the insulating film with an etching gas that includes oxygen by a plasma dry etching method; measuring a first level difference between the surface of the metal wire and the surface of the insulating film by a non-contact measurement method; removing the metal oxide film on the surface of the metal film using a chemical; measuring a second level difference between the surface of the metal film and the surface of the insulating film by a non-contact measurement method; and determining the amount of oxidation of the metal wire from the difference between the first level difference and the second level difference.

The manufacturing method of a semiconductor device according to the third aspect of the invention is further characterized in that the metal is copper, and the chemical is an organic acid that contains ammonium fluoride in the manufacturing method of a semiconductor device.

The manufacturing method of a semiconductor device according to the fourth aspect of the present invention is further characterized in that the non-contact measuring method is carried out using an atomic force microscope in the manufacturing method of a semiconductor device.

The manufacturing method of a semiconductor device according to the fifth aspect of the present invention is further characterized in that the non-contact measuring method is carried out by means of a spectroscopic ellipsometer in the manufacturing method of a semiconductor device.

The manufacturing method of a semiconductor device according to the sixth aspect of the present invention is further characterized in that the radio frequency output of the dry etching unit that is optimal for use in the plasma dry etching is determined from the amount of oxidation of the metal wire, and is fed back to the next plasma dry etching in the manufacturing method of a semiconductor device.

The manufacturing method of a semiconductor device according to the seventh aspect of the present invention is further characterized in that the time of etching that is optimal for the use in the plasma dry etching is determined from the amount of oxidation of the metal wire, and is fed back to the next plasma dry etching in the manufacturing method of a semiconductor device.

The manufacturing method of a semiconductor device according to the eighth aspect of the present invention is further characterized in that, in the manufacturing method of a semiconductor device according to the seventh aspect of the invention, the time of etching is determined according to the following equation (1):

$$t = t_{typ} + \{T_{target} - (H1 - H0)\}/R_{CuO} \quad (1)$$

where t (sec) is the optimal time of etching to be determined, H0 (nm) is the first level difference, H1 (nm) is the second level difference, $T_{target}$ (nm) is a tolerable H1−H0 value, $t_{typ}$ is an actual time of etching, and $R_{CuO}$ (nm/min) is the rate of metal oxidation during etching.

DESCRIPTION OF THE PREFERRED EMBODIMENTS (Embodiment 1)

In the following, a manufacturing method of a semiconductor device according to Embodiment 1 of the present invention will be described with reference to FIGS. 1A to 1F and 4.

Figure 1A:
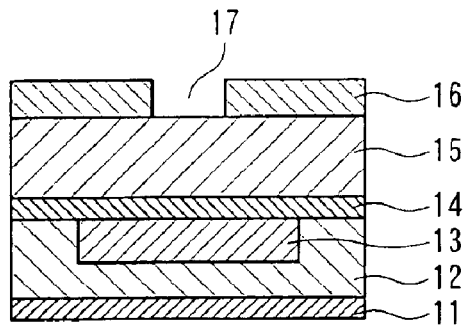
FIG. 1A is a cross sectional view showing a process of forming a resist pattern of a via hole according to an embodiment of the present invention.
Figure 1D:
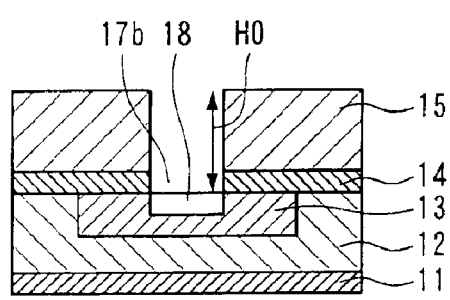
FIG. 1D is a cross sectional view showing a process of forming an aperture in an insulating film according to an embodiment of the present invention.
Figure 1B:
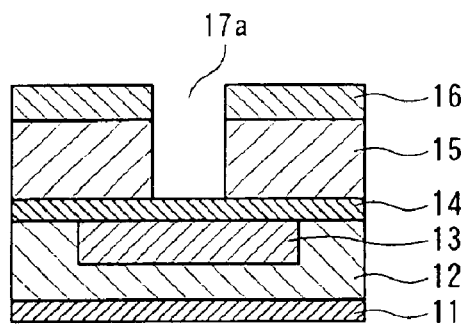
FIG. 1B is a cross sectional view showing a process of forming the via hole according to an embodiment of the present invention.
Figure 1E:
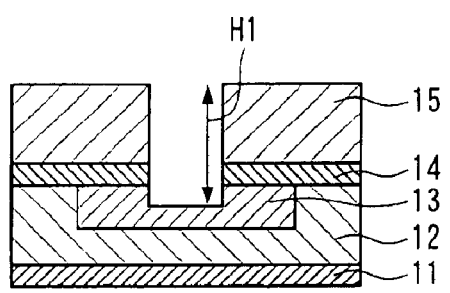
FIG. 1E is a cross sectional view showing a process of cleaning the bottom of the via hole according to an embodiment of the present invention.
Figure 1C:
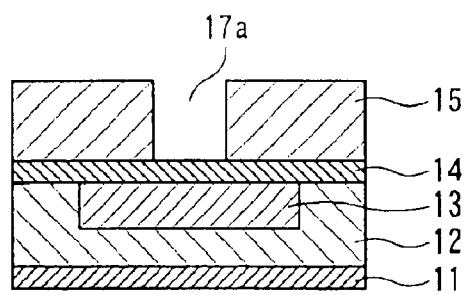
FIG. 1C is a cross sectional view showing a process of removing the resist pattern according to an embodiment of the present invention.
Figure 1F:
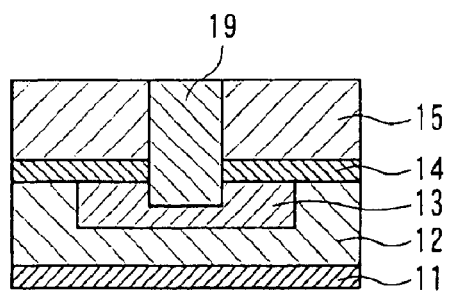
FIG. 1F is a cross sectional view showing a process of forming a metal plug according to an embodiment of the present invention.

FIGS. 1A to 1F are cross sectional views showing a semiconductor device that uses a copper wire in the order of the manufacturing process according to the present invention, wherein FIG. 1A is a cross sectional view showing the inventive process of forming a via hole resist pattern, FIG. 1B is a cross sectional view showing the inventive process of forming a via hole, FIG. 1C is a cross sectional view showing the inventive process removing the resist pattern, FIG. 1D is a cross sectional view showing the inventive process of forming an aperture in an insulating film, FIG. 1E is a cross sectional view showing the inventive process of cleaning the bottom of the via hole, and FIG. 1F is a cross sectional view showing the inventive process of forming a metal plug.

First, in the process of forming a resist pattern shown in FIG. 1A, a copper wire 13 is formed in a manner wherein the side surfaces and the bottom surface of the copper wire are covered with an insulating film 12 made of silicon oxide above, for example, a semiconductor substrate 11 made of silicon. Subsequently, an insulating film 14 made of silicon nitride is formed on the insulating film 12 and on top of the copper wire 13. After an insulating film 15 made of silicon oxide is formed on the insulating film 14, a resist pattern 16 with an opening 17 is formed.

Next, in the process of forming a via hole shown in FIG. 1B, etching is carried out on the insulating film 15 using the resist pattern 16 as a mask by the plasma dry etching method, so that a via hole 17a is formed.

Next, in the ashing process shown in FIG. 1C, the resist pattern 16 is removed and, after that, in the process of exposing the surface of the metal wire shown in FIG. 1D, the entire surface of the semiconductor device is etched back by the plasma dry etching method, so that a via hole 17b is formed so as to expose the copper wire 13 from the insulating film 14. As for the etching conditions at this time, a parallel plate type RIE unit, for example, is used wherein the flow rate of $CF_4$ which is an etching gas is set at 50 sccm, the flow rate of $O_2$ which is a control gas for etching deposit is set at 10 sccm, the temperature of the substrate is set at 25° C., the RF output is set at 300 W and the pressure is set at 5 Pa. At this time, $O_2$ is used for controlling the process of forming an etching deposit which is a reaction product between the insulating film 14 and the etching gas; therefore, the surface of the base copper wire 13 is oxidized, so that a copper oxide layer 18 is formed. Thus, after the completion of the plasma dry etching, the height H0 of the level difference between the surface of the insulating film 15 and the surface of the copper oxide layer 18 is measured using an atomic force microscope (hereinafter referred to as AFM).

Next, as shown in FIG. 1E, the semiconductor device is cleaned with a chemical, having etching selectivities of the copper oxide 18/the copper wire 13 and the copper oxide 18/the insulating film 15 that are almost infinite, in a typical cleaning manner using organic acids such as ammonium fluoride and ammonium acetate, so that the copper oxide layer 18 is removed. After that, the height H1 of the level difference between the surface of the insulating film 15 and the surface of the copper wire 13 is measured by the same method as in FIG. 1D. After this measurement, a part of the upper layer wire is formed of a metal plug 19, made of copper or the like, that includes portions which make contact with the bottom and the walls of the via hole 17b as shown in FIG. 1F.

Though the manufacturing process is completed in the above described manner, the film thickness of the copper oxide layer 18 formed on the base copper wire 13 can be quantitatively obtained with ease according to the following relational equation (2):

$$\text{(Copper oxide layer } \mathbf{18}) = (H1) - (H0) \quad (2)$$

As described above, according to Embodiment 1, the level difference is measured by means of an AFM, which is a non-contact system, before and after removing the copper oxide 18 in the process of forming a copper wire in a semiconductor device; therefore, the amount of oxidation of the copper wire can be quantitatively obtained with ease. This method is easy, non-contact and high in precision; therefore, a sample semiconductor substrate is extracted during the manufacturing so as to be measured and this substrate can be returned to the manufacturing line after completion of the measurement. That is to say, it is possible to use this method of an in-line management. Therefore, an excessive oxidation on the surface of a copper wire in a semiconductor device can be detected through the in-line management and the dispersion in the contact resistance between the copper wire and the copper plug can be detected in advance unlike a conventional inspection by means of a SIMS or the like in which a substrate is broken.

Figure 4:
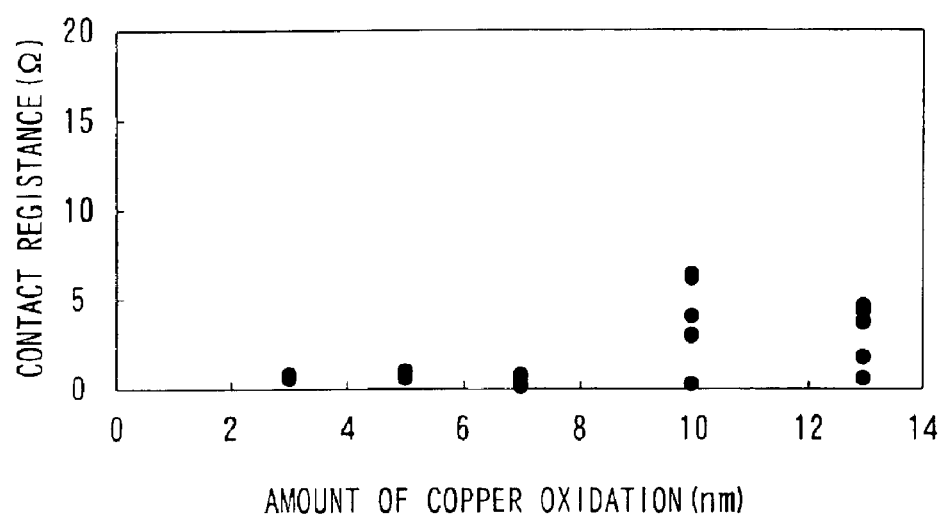
FIG. 4 is a graph showing a relationship between the amount of copper oxidation and the contact resistance in manufacturing of a semiconductor device.
Figure 5A:
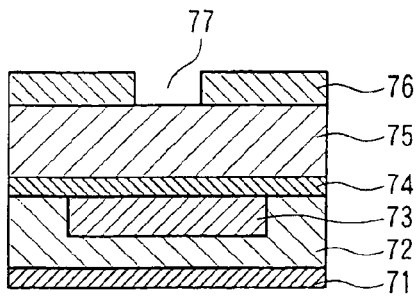
FIG. 5A is a cross sectional view showing a conventional process of forming a resist pattern of a via hole.
Figure 5D:
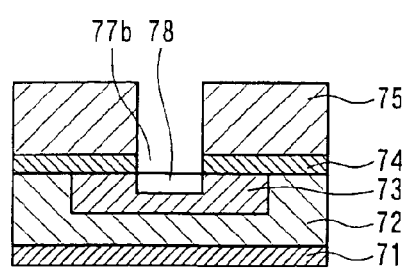
FIG. 5D is a cross sectional view showing a conventional process of forming an aperture in an insulating film.
Figure 5B:
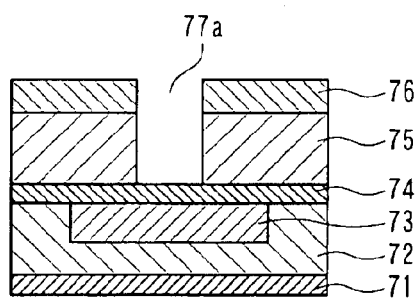
FIG. 5B is a cross sectional view showing a conventional process of forming a via hole.
Figure 5E:
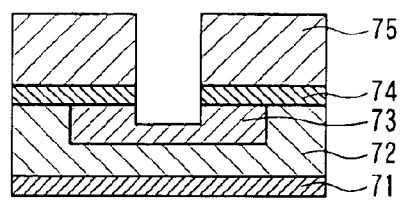
FIG. 5E is a cross sectional view showing a conventional process of cleaning the bottom of the via hole.
Figure 5C:
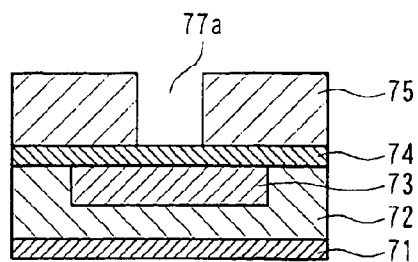
FIG. 5C is a cross sectional view showing a conventional process of removing the resist pattern.
Figure 5F:
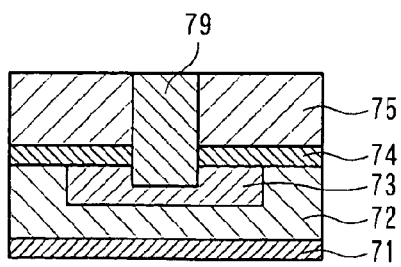
FIG. 5F is a cross sectional view showing a conventional process of forming a metal plug.

One semiconductor substrate, for example, is extracted during the manufacturing and H0 and H1 are measured at ten different contacts in a process monitor pattern formed on the scribe lanes of the semiconductor substrate so that the manufacturing process is continued without change in the case where the difference between H0 and H1 indicates the thickness of the copper oxide film to be 7 nm or less with reference to FIG. 4, while measures such as changing the dry etching conditions can be taken in the case where the thickness of the copper oxide film is 7 nm or more.

Here, though a quantitatively obtaining method of the amount of copper oxidation after the process of the plasma dry etching is described in the present embodiment, in the case where copper oxidation occurs in the process of plasma ashing where oxygen plasma is used, the amount of such copper oxidation can also be quantitatively obtained using this method in the same manner. In addition, though copper is used as the wire material in the present embodiment, the same effect can be gained for wires made of W or Al. Furthermore, though an AFM is used for the measurements of level differences H0 and H1 in the present embodiment, the same measurements are possible using a spectroscopic ellipsometer which allows for the measurements of the film thickness of a copper oxide film in a non-contact manner.

(Embodiment 2)

In the following, a manufacturing method of a semiconductor device according to Embodiment 2 of the present invention will be described with reference to FIGS. 1A–1F and 2. Here, the manufacturing process according to the present embodiment is similar to that shown in Embodiment 1, and as described above, copper oxide is formed after the dry etching in the process of forming an aperture in the insulating film 14 by means of dry etching in FIG. 1D.

Figure 2:
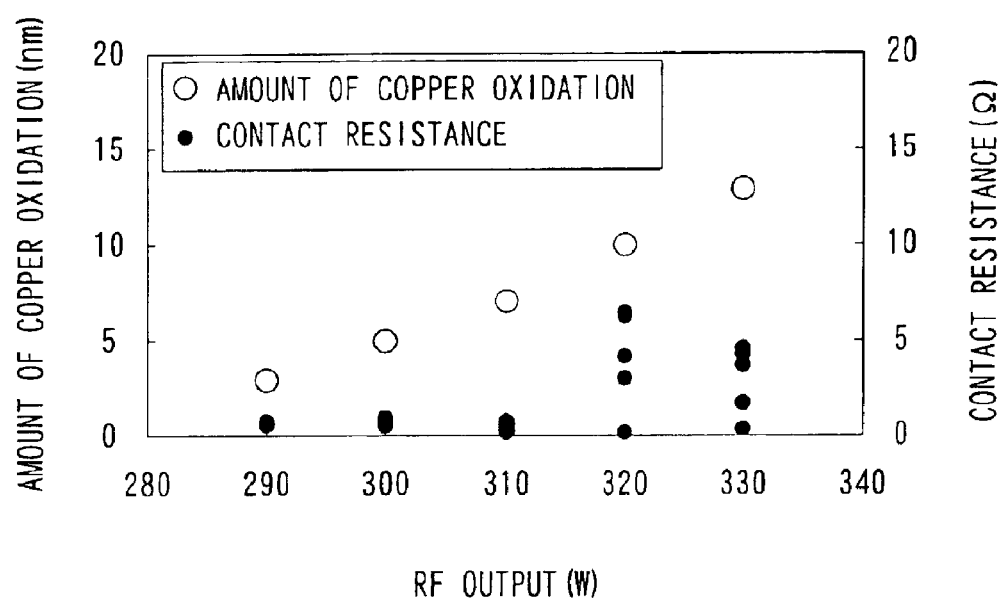
FIG. 2 is a graph showing a relationship of the RF output of a dry etching unit with respect to the amount of copper oxidation and the contact resistance.

FIG. 2 is a graph showing the relationship between the RF output of a dry etching unit with respect to the amount of copper oxidation and the RF output of a dry etching unit and the contact resistance.

As is seen from FIG. 2, the amount of the formation of copper oxide increases as the RF output increases, and the dispersion in the contact resistance becomes great where the RF output gets as high as 320 W and the amount of copper oxidation becomes 10 nm or more. This is because ionized oxygen in plasma is accelerated by a bias voltage that has been generated in the vicinity of the surface of the semiconductor substrate and is implanted into the copper wire 13, so that the copper oxide layer 18, which is an insulating layer, is formed.

As described above, the amount of copper oxidation and the contact resistance are parameters sensitive to the RF output, and therefore, the amount of copper oxidation is measured using the in-line method in the manufacturing process of a semiconductor device by the measurement method described in Embodiment 1 in a manner, for example, where the RF output is detected as abnormal when the amount of copper oxidation exceeds a predetermined amount, and thereby, the next RF output of the plasma dry etching unit is adjusted so as to limit the dispersion in the contact resistance.

As described above, according to Embodiment 2, the amount of oxidation of a copper wire can be quantitatively obtained with ease through the in-line management, and thereby, the detection of the abnormal RF output is fed back to the plasma dry etching unit, so that the dispersion of the contact resistance can be restricted.

(Embodiment 3)

A manufacturing method of a semiconductor device according to Embodiment 3 of the present invention will be described with reference to FIGS. 1A to 1F, 3 and 4. Here, the structures in the cross sections during the manufacturing process in accordance with the manufacturing method of a semiconductor device according to Embodiment 3 are similar to those in Embodiment 1, while the manufacturing method of a semiconductor device according to Embodiment 3 includes the process of quantitatively obtaining the amount of copper oxidation from relational equation (2) so as to feed back the measurement results to the time of etching of the insulating film 14.

As described above, the copper oxide layer 18 has grown after the dry etching during the process of forming an aperture in the insulating film 14 by means of dry etching of FIG. 1D.

Figure 3:
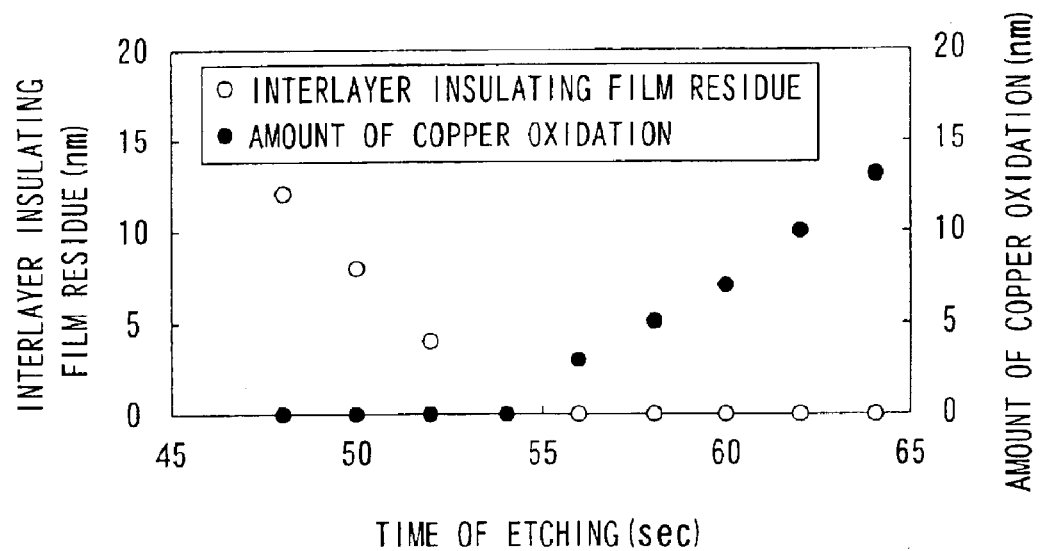
FIG. 3 is a graph showing the relationship of an insulating film etching time with respect to the amount of copper oxidation and the insulating film residue.

FIG. 3 is a graph showing the relationship between the time of etching of an insulating film and the amount of copper oxidation, as well as between the time of etching of an insulating film and the insulating film residue, and it shows the relationship as a result of experiments between the time of etching that is measured starting from the etching of the insulating film 14 and the amount of copper oxidation after the surface of the copper wire 13 has been exposed, as well as between the time of etching and the residue of the insulating film 14.

In FIG. 3, the residue of the insulating film 14 decreases and the via hole 17b is formed so as to expose the surface of the copper wire 13 as the time of etching of the insulating film 14 increases. Furthermore, a copper oxide 48 is formed on the copper wire 13 as the etching continues and FIG. 3 indicates that the copper oxide increases as the time of etching increases. As shown in FIG. 4, however, the dispersion in the contact resistance increases as the amount of copper oxidation increases, and the dispersion becomes significant when the amount of copper oxidation becomes approximately 10 nm or more.

As is clear from the above results, the insulating film residue becomes 0 (condition where the via hole 17b is completely open) in the present embodiment, and the time of etching of the insulating film 14 is controlled so that the amount of copper oxidation afterwards is in the tolerable range of 0 to about 8 nm, and thereby, the dispersion in the contact resistance is restricted. This time of etching can be calculated from the following relational equation (3):

$$t=t_{typ}+\{T_{target}-(H1-H0)\}/R_{CuO} \quad (3)$$

where t (sec) is the time of etching after the feedback for adjusting the amount of copper oxidation within a tolerable range, $t_{typ}$ (sec) is the time of etching of the insulating film that has been determined in advance, $T_{target}$ (nm) is a target value (constant) of the tolerable amount of copper oxidation, (H1–H0) (nm) is the amount of copper oxidation that has been measured during the process, and $R_{CuO}$ (nm/min) is the rate of copper oxidation during etching (constant).

Here, the above equation will be further described. "$t_{typ}$" is the time of etching of the insulating film that has been determined in advance and this is the sum of the time for the exact finish of the etching of the insulating film 14 and the time of over-etching after the surface of the copper wire has been exposed and this becomes the time of actual etching during the process. (H1–H0) is the amount of copper oxidation that has occurred as a result of actual etching; therefore, $T_{target}$–(H1–H0) is a shifted amount from the tolerance of the amount of copper oxidation, and $R_{CuO}$ is the rate of copper oxidation during the etching. As a result, $\{T_{target}-(H1-H0)\}/R_{CuO}$ is the time of the etching shift that corresponds to the shifted amount from the tolerance, that is to say, the time required for returning the amount of copper oxidation to the tolerable amount of copper oxidation. Accordingly, equation (3) becomes the time of etching of the insulating film for allowing the amount of copper oxidation to be within the tolerable range.

The time $t_{typ}$ of etching carried out in the process is set at 54 sec, for example, and the target value $T_{target}$ of the amount of copper oxidation is set at 4 nm and the rate $R_{CuO}$ of copper oxidation is set at 1.4 nm/sec (calculated from FIG. 3). When it is assumed that (H1–H0)=2 nm as measured in FIGS. 1D and 1E, the time t of etching after the feedback is calculated as follows:

$$t=t_{typ}+\{T_{target}-(H1-H0)\}/R_{CuO}$$

$$t=54+\{4-2\}/1.4=55.4 \text{sec}$$

As described above, the amount of oxidation of a copper wire can be quantitatively obtained with ease through the in-line management according to Embodiment 3, while the amount of copper oxidation depends on the time of plasma dry etching; therefore, the amount of copper oxidation is fed back to the control of the time of etching of the insulating film 14 so as to be adjusted. This time of etching of the insulating film that has been adjusted as a result of feedback is applied to the insulating film 14 which has been formed on the semiconductor substrate and which is to be processed next by means of etching; thereby, the amount of oxidation is set within the tolerance, so that the dispersion in the contact resistance can be prevented.

Though an example of copper is shown as a metal wire in the above described first to third embodiments, the present invention can be applied to materials such as tungsten, aluminum or materials having these metals as their main components.

As described above, according to the manufacturing method of a semiconductor device of the present invention, the depth of a via hole immediately after etching and the depth of the via hole after the removal of the metal oxide film can be measured by means of a non-contact measurement method in the process of the formation of a via hole. As a result, the amount of metal oxidation can be quantitatively obtained with ease within the manufacturing line, and depending on any one of the embodiments of the present invention, also, the quantitatively obtained results are fed back to the process conditions or the control of the time of etching in the etching unit, so that the dispersion in the contact resistance can be restricted.

What is claimed is:

1. A manufacturing method of a semiconductor device, comprising the steps of:

forming a metal wire on a circuit formed on a semiconductor substrate;

forming an insulating film on the metal wire;

forming a via hole in the insulating film so as to expose a surface of the metal wire by selectively etching the insulating film by a plasma dry etching method;

measuring a first level difference between the surface of the metal wire and the surface of the insulating film by a non-contact measurement method;

removing a metal oxide film located on the surface of the metal film by cleaning the surface of the metal film;

measuring a second level difference between the surface of the metal film and the surface of the insulating film by a non-contact measurement method; and determining an amount of oxidation of the metal wire from a difference between the first level difference and the second level difference.

2. A manufacturing method of a semiconductor device, comprising the steps of:

forming a metal wire on a circuit formed on a semiconductor substrate;

forming an insulating film on the metal wire;

forming a via hole in the insulating film so as to expose a surface of the metal wire by selectively etching the insulating film with an etching gas containing oxygen by a plasma dry etching method;

measuring a first level difference between the surface of the metal wire and the surface of the insulating film by a non-contact measurement method;

removing a metal oxide film located on the surface of the metal film using a chemical;

measuring a second level difference between the surface of the metal film and the surface of the insulating film by a non-contact measurement method; and determining an amount of oxidation of the metal wire from a difference between the first level difference and the second level difference.

3. The manufacturing method of a semiconductor device according to claim 2, wherein the metal is copper, and the chemical is an organic acid containing ammonium fluoride.

4. The manufacturing method of a semiconductor device according to claim 1, wherein the non-contact measuring method is carried out using an atomic force microscope.

5. The manufacturing method of a semiconductor device according to claim 1, wherein the non-contact measuring method is carried out by means of a spectroscopic ellipsometer.

6. The manufacturing method of a semiconductor device according to claim 1, wherein a radio frequency output of the dry etching unit is determined from the amount of oxidation of the metal wire, and fed back to the next plasma dry etching, the radio frequency output being optimal for use in the plasma dry etching.

7. The manufacturing method of a semiconductor device according to claim 1, wherein a time of etching is determined from the amount of oxidation of the metal wire and fed back to the next plasma dry etching, the time of etching being optimal for use in the plasma dry etching.

8. The manufacturing method of a semiconductor device according to claim 7, wherein the time of etching is determined according to the following equation (1):

$$t = t_{typ} + \{T_{target} - (H1 - H0)\}/R_{CuO} \tag{1}$$

where t (sec) is the optimal time of etching to be determined, H0 (nm) is the first level difference, H1 (nm) is the second level difference, $T_{target}$ (nm) is a tolerable H1−H0 value, $t_{typ}$ is an actual time of etching, and $R_{CuO}$ (nm/mm) is a rate of metal oxidation during etching.

* * * * *